(12) United States Patent
Anglin et al.

(10) Patent No.: US 12,500,398 B2
(45) Date of Patent: Dec. 16, 2025

(54) ELECTRICAL ASSEMBLY

(71) Applicant: Lear Corporation, Southfield, MI (US)

(72) Inventors: Aric Anglin, Rives Junction, MI (US); Ajmal Ansari, Canton, MI (US); Jesus Carbo, Valls (ES)

(73) Assignee: Lear Corporation, Southfield, MI (US)

( * ) Notice: Subject to any disclaimer, the term of this patent is extended or adjusted under 35 U.S.C. 154(b) by 93 days.

(21) Appl. No.: 18/085,977

(22) Filed: Dec. 21, 2022

(65) Prior Publication Data

US 2023/0118180 A1 Apr. 20, 2023

Related U.S. Application Data

(63) Continuation-in-part of application No. 17/495,131, filed on Oct. 6, 2021, now Pat. No. 11,858,437, and a continuation-in-part of application No. 17/495,075, filed on Oct. 6, 2021, now Pat. No. 11,735,891, which is a continuation-in-part of application No. 17/395,082, filed on Aug. 5, 2021, now Pat. No. 11,558,963, which is a continuation-in-part of application No. 17/223,738, filed on Apr. 6, 2021, now Pat. No. 11,721,956, application No. 18/085,977 is a continuation-in-part of application No.
(Continued)

(51) Int. Cl.
*H02B 1/56* (2006.01)
*H02B 1/20* (2006.01)
*H02G 5/10* (2006.01)
*H05K 7/20* (2006.01)

(52) U.S. Cl.
CPC ............... *H02B 1/56* (2013.01); *H02B 1/20* (2013.01); *H02G 5/10* (2013.01); *H05K 7/20* (2013.01)

(58) Field of Classification Search
None
See application file for complete search history.

(56) References Cited

U.S. PATENT DOCUMENTS

| | | |
|---|---|---|
| 2,984,080 A | 5/1961 | Sliepcevich |
| 5,017,859 A | 5/1991 | Engel et al. |

(Continued)

FOREIGN PATENT DOCUMENTS

| | | |
|---|---|---|
| CN | 1267124 A | 9/2000 |
| CN | 102945762 A | 2/2013 |

(Continued)

OTHER PUBLICATIONS

Chinese Office Action dated Dec. 9, 2021 related to corresponding Chinese Patent Application No. 201911043389.7. (English Translation provided by Foreign Associate) (17 pages).

(Continued)

*Primary Examiner* — Courtney L Smith
(74) *Attorney, Agent, or Firm* — Fishman Stewart PLLC

(57) ABSTRACT

An assembly includes an electrical component; a bus bar assembly connected with the electrical component; and a cooling member connected with the bus bar assembly, the cooling member including: a tubular member; and a cover enclosing portions of the tubular member, the cover comprising thermally conductive and electrically insulating material. The enclosed portions of the tubular member may include a non-circular cross-section.

19 Claims, 11 Drawing Sheets

Related U.S. Application Data

17/071,588, filed on Oct. 15, 2020, now Pat. No. 11,547,024, and a continuation-in-part of application No. 16/592,126, filed on Oct. 3, 2019, now Pat. No. 10,971,873.

(60) Provisional application No. 62/915,568, filed on Oct. 15, 2019, provisional application No. 62/753,383, filed on Oct. 31, 2018.

(56) References Cited

U.S. PATENT DOCUMENTS

| | | | |
|---|---|---|---|
| 5,504,378 A | 4/1996 | Lindberg et al. | |
| 5,567,991 A | 10/1996 | Schantz et al. | |
| 6,198,630 B1 | 3/2001 | Cromwell | |
| 6,236,566 B1 | 5/2001 | Regnier et al. | |
| 6,351,113 B1 | 2/2002 | Becker | |
| 6,693,370 B2 | 2/2004 | Yamane et al. | |
| 6,916,122 B2 | 7/2005 | Branch et al. | |
| 6,948,950 B2 | 9/2005 | Yamaguchi | |
| 7,164,584 B2 | 1/2007 | Walz | |
| 7,315,448 B1 | 1/2008 | Bash et al. | |
| 7,371,965 B2 | 5/2008 | Ice | |
| 7,393,236 B2 | 7/2008 | Thompson et al. | |
| 7,453,695 B2 | 11/2008 | Ohnishi et al. | |
| 7,837,496 B1 | 11/2010 | Pal | |
| 7,876,561 B2* | 1/2011 | Schnetzka | H02P 29/50 361/699 |
| 7,888,601 B2 | 2/2011 | Bax et al. | |
| 8,520,386 B2 | 8/2013 | Bott et al. | |
| 8,552,824 B1* | 10/2013 | Pal | H01H 50/12 335/185 |
| 8,597,785 B2 | 12/2013 | Komiyatani et al. | |
| 8,760,855 B2* | 6/2014 | Howes | H05K 7/20936 361/677 |
| 8,963,020 B2 | 2/2015 | Buchwalter et al. | |
| 9,137,925 B2 | 9/2015 | Pal et al. | |
| 9,142,364 B2* | 9/2015 | Pal | H01H 1/62 |
| 9,153,946 B2 | 10/2015 | Pal | |
| 9,313,930 B2 | 4/2016 | Goth et al. | |
| 9,660,244 B2 | 5/2017 | Dinkelman et al. | |
| 9,666,968 B2 | 5/2017 | Menzies et al. | |
| 9,667,040 B2 | 5/2017 | Fujita et al. | |
| 9,698,578 B1 | 7/2017 | Jackson | |
| 9,855,903 B1 | 1/2018 | Pal | |
| 9,930,789 B2 | 3/2018 | Low | |
| 9,943,016 B2* | 4/2018 | Pietrantonio | H05K 7/20927 |
| 9,991,655 B2 | 6/2018 | Pal | |
| 10,057,974 B2 | 8/2018 | Pal | |
| 10,241,153 B2 | 3/2019 | Rink et al. | |
| 10,270,231 B2* | 4/2019 | Pal | H01H 1/62 |
| 10,279,760 B2* | 5/2019 | Froeschl | B60R 16/03 |
| 10,368,465 B2 | 7/2019 | Aragones Carrete | |
| 10,466,314 B2 | 11/2019 | Vorndran | |
| 10,476,184 B2 | 11/2019 | Menez et al. | |
| 10,523,094 B2 | 12/2019 | Wang et al. | |
| 10,617,044 B2 | 4/2020 | Umino | |
| 10,714,910 B2 | 7/2020 | Schmitt et al. | |
| 10,720,231 B1 | 7/2020 | Konerding | |
| 10,782,322 B2 | 9/2020 | Hanley et al. | |
| 10,919,465 B2 | 2/2021 | Takamatsu et al. | |
| 10,943,752 B2 | 3/2021 | Hiramitsu | |
| 10,971,873 B2 | 4/2021 | Rai | |
| 11,163,007 B2 | 11/2021 | Song | |
| 11,539,158 B2 | 12/2022 | Mathews | |
| 11,690,199 B2 | 6/2023 | Revankar | |
| 2002/0122289 A1 | 9/2002 | Meiners | |
| 2002/0127904 A1 | 9/2002 | Aoki | |
| 2003/0133267 A1* | 7/2003 | Beihoff | B60L 15/007 361/704 |
| 2006/0007720 A1* | 1/2006 | Pfeifer | H05K 7/20927 361/698 |
| 2006/0120001 A1 | 6/2006 | Weber et al. | |
| 2010/0038133 A1 | 2/2010 | Senk | |
| 2011/0206948 A1 | 8/2011 | Asai et al. | |
| 2012/0236500 A1* | 9/2012 | Higuchi | H01L 23/473 361/699 |
| 2014/0087584 A1* | 3/2014 | Pal | H02B 1/056 439/485 |
| 2014/0176270 A1 | 6/2014 | Temnykh | |
| 2014/0293516 A1 | 10/2014 | Swift | |
| 2016/0172126 A1 | 6/2016 | Pal et al. | |
| 2017/0076877 A1 | 3/2017 | Pal | |
| 2017/0279250 A1 | 9/2017 | Pal | |
| 2018/0009399 A1 | 1/2018 | Pal | |
| 2018/0132343 A1* | 5/2018 | Pal | H05K 1/0203 |
| 2018/0330906 A1 | 11/2018 | Hiramitsu et al. | |
| 2018/0366922 A1 | 12/2018 | Pal et al. | |
| 2019/0075678 A1 | 3/2019 | Aragones Carrete | |
| 2019/0214799 A1 | 7/2019 | Pal et al. | |
| 2020/0136326 A1 | 4/2020 | Rai et al. | |
| 2020/0244178 A1* | 7/2020 | Soles | H02M 1/44 |
| 2021/0327670 A1 | 10/2021 | Mori | |

FOREIGN PATENT DOCUMENTS

| | | |
|---|---|---|
| CN | 105609366 A | 5/2016 |
| CN | 107579385 A | 1/2018 |
| CN | 108352274 A | 7/2018 |
| CN | 208904405 U | 5/2019 |
| CN | 111129407 A | 5/2020 |
| CN | 111480084 A | 7/2020 |
| CN | 211980525 U | 11/2020 |
| CN | 112291991 A | 1/2021 |
| CN | 112335346 A | 2/2021 |
| CN | 112467487 A | 3/2021 |
| DE | 102006006328 A1 | 8/2006 |
| DE | 102016218049 A1 | 3/2018 |
| JP | 5621882 B2 | 11/2014 |
| WO | 13124117 A1 | 8/2013 |
| WO | 17125283 A1 | 7/2017 |
| WO | 2021059767 A1 | 4/2021 |

OTHER PUBLICATIONS

Chinese Office Action dated Apr. 21, 2023 related to corresponding Chinese Patent Application No. 202210145946.1.
Chinese Office Action, CN202210234431.9, dated Jul. 11, 2025 (w_machine_translation).
Chinese Search Report, CN202210234431.9, dated Jul. 9, 2025 (w_machine_translation).
Chinese Office Action, CN202210234094.3, dated Jul. 26, 2025 (w_translation).
Chinese Office Action, CN202210146981.5, dated Sep. 30, 2025 (w_translation).

* cited by examiner

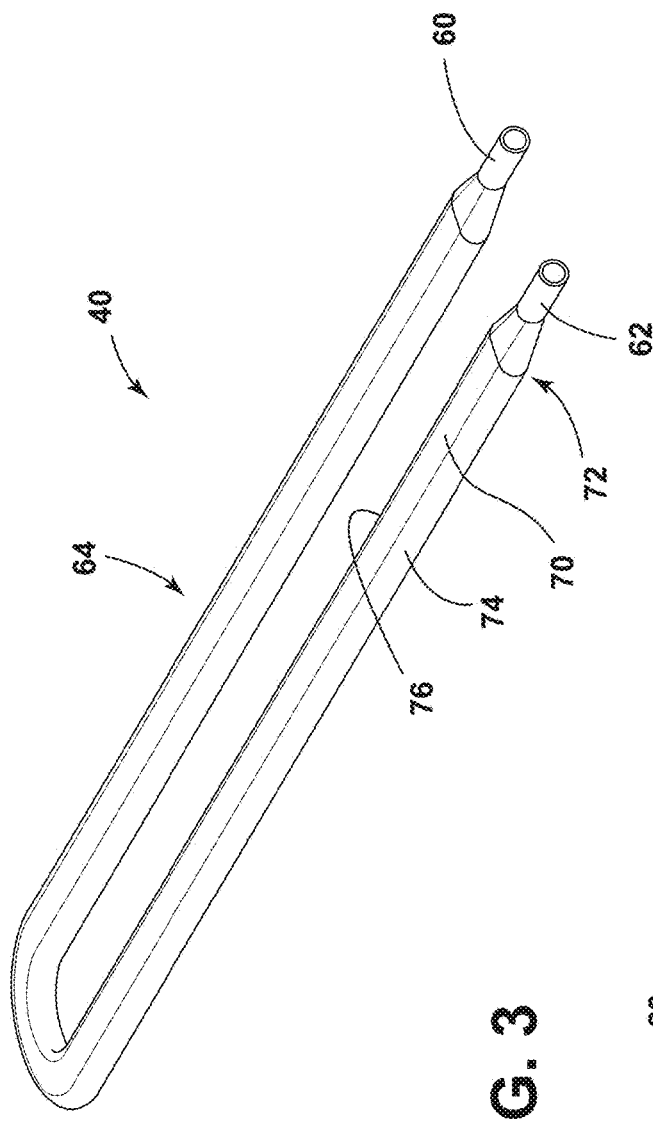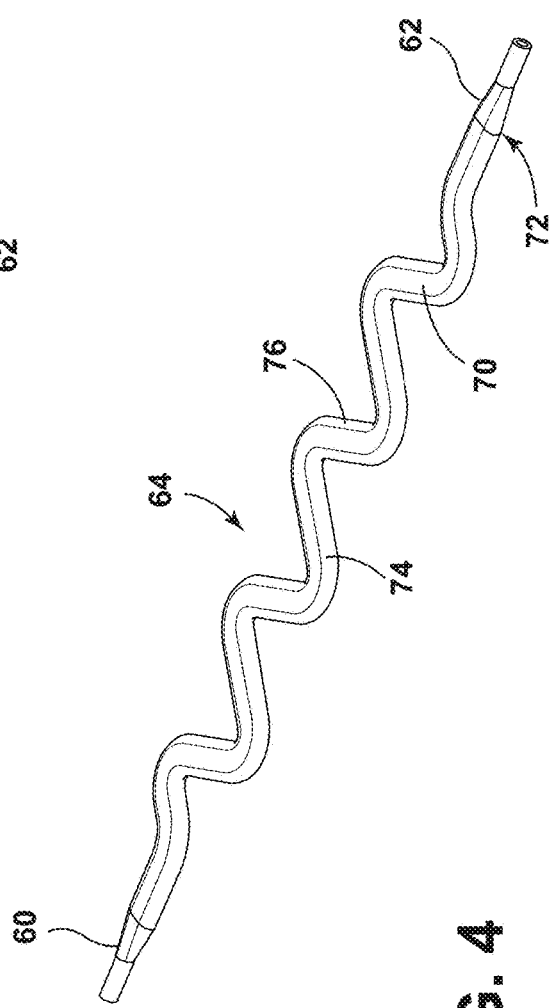

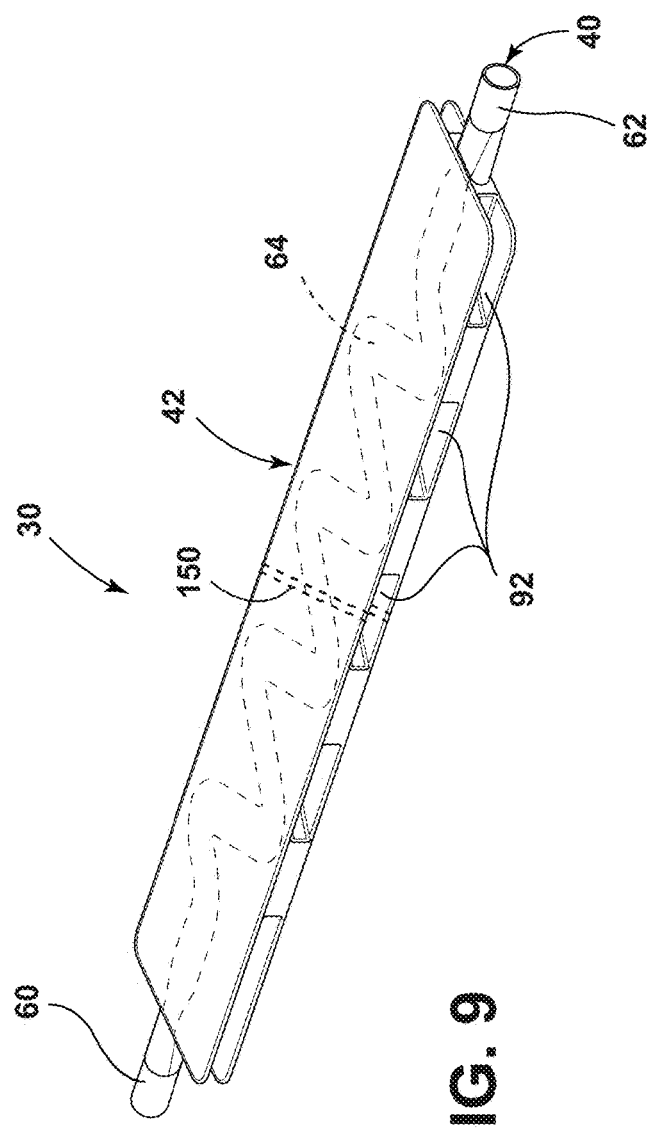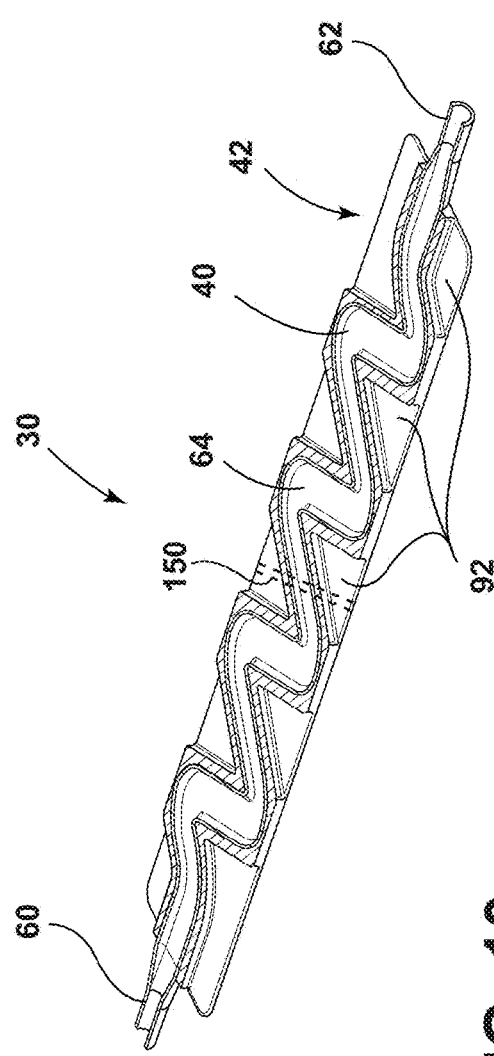

ELECTRICAL ASSEMBLY

CROSS-REFERENCE TO RELATED APPLICATION

This application is a continuation-in-part application of U.S. patent application Ser. Nos. 17/495,075 and 17/495,131, both filed Oct. 6, 2021, both of which are continuation-in-part applications of U.S. patent application Ser. No. 17/395,082, filed Aug. 5, 2021, which is a continuation-part-application of U.S. patent application Ser. No. 17/223,738, filed Apr. 6, 2021, which is (i) a continuation-in-part application of U.S. patent application Ser. No. 16/592,126, filed Oct. 3, 2019, now U.S. Pat. No. 10,971,873, which claims the benefit of U.S. Provisional Patent Application Ser. No. 62/753,383, filed on Oct. 31, 2018, and (ii) a continuation-in-part application of U.S. patent application Ser. No. 17/071,588, filed Oct. 15, 2020, which claims the benefit of U.S. Provisional Patent Application Ser. No. 62/915,568, filed on Oct. 15, 2019. This application is also a direct continuation-in-part application of U.S. patent application Ser. No. 17/071,588, filed Oct. 15, 2020, which, as noted above, claims the benefit of U.S. Provisional Patent Application Ser. No. 62/915,568, filed on Oct. 15, 2019.

The disclosures of all of the foregoing are hereby incorporated by reference in their entireties as though fully set forth herein.

TECHNICAL FIELD

The present disclosure generally relates to electrical assemblies and cooling of electrical assemblies, including electrical assemblies that may be used with high currents and/or that may include active cooling systems.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

FIG. 3 is a perspective view generally illustrating an embodiment of a tubular member of a cooling member of an electrical assembly according to teachings of the present disclosure.

FIG. 4 is a perspective view generally illustrating an embodiment of a tubular member of a cooling member of an electrical assembly according to teachings of the present disclosure.

FIG. 9 is a perspective view generally illustrating an embodiment of a cooling member of an electrical assembly according to teachings of the present disclosure.

FIG. 10 is a cross-sectional perspective view generally illustrating an embodiment of a cooling member of an electrical assembly according to teachings of the present disclosure.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
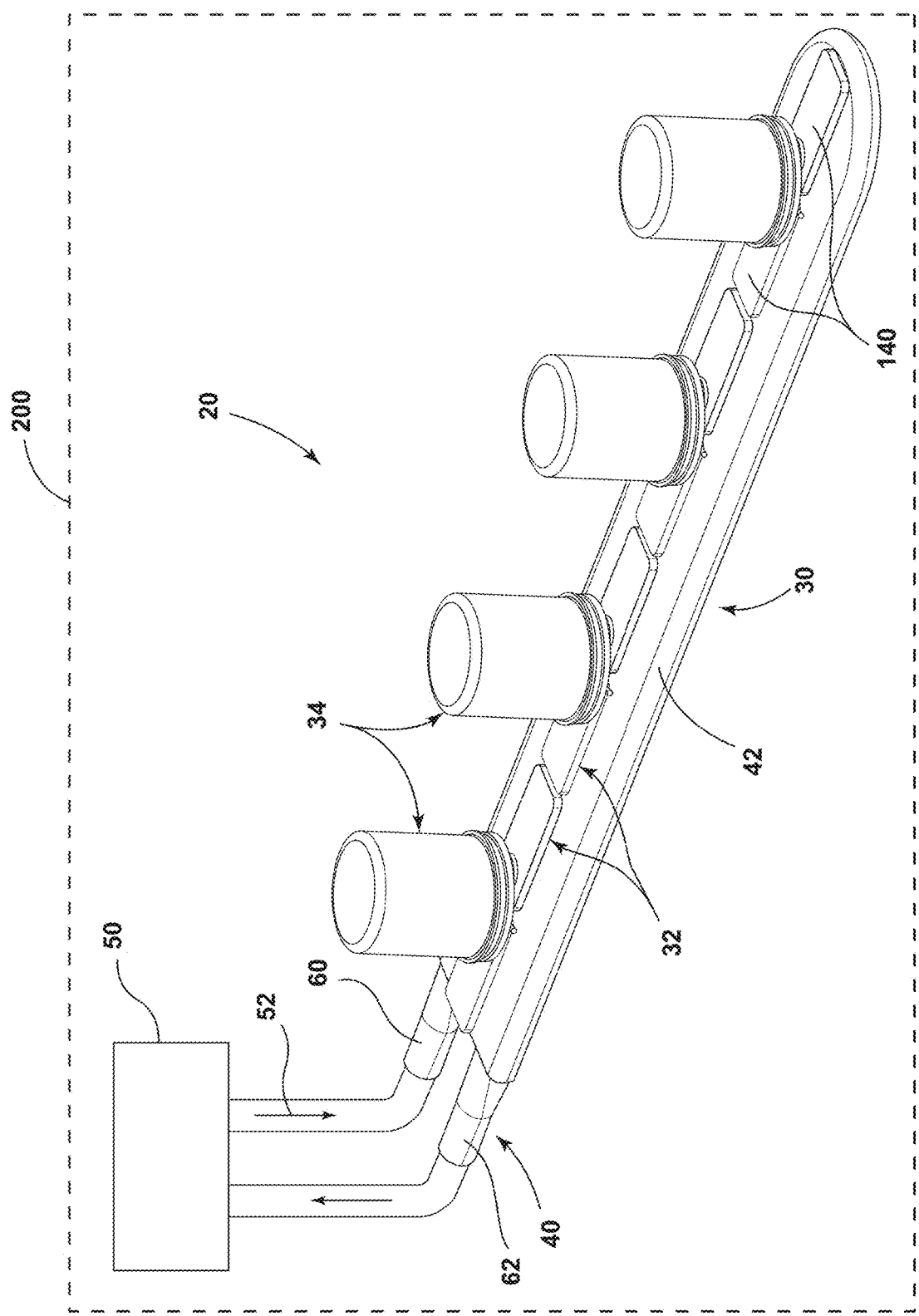
FIG. 1 is a perspective view generally illustrating an embodiment of an electrical assembly according to teachings of the present disclosure.
Figure 2:
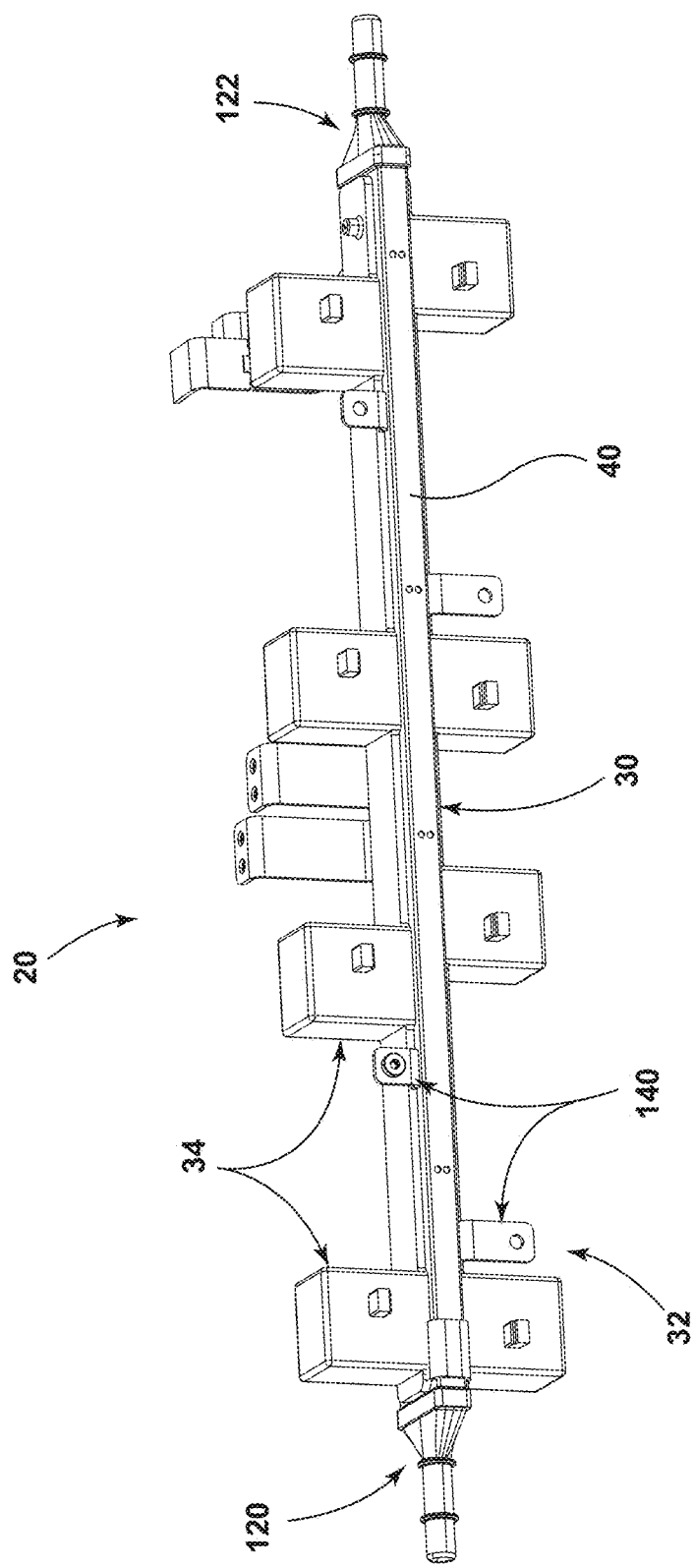
FIG. 2 is a perspective view generally illustrating an embodiment of an electrical assembly according to teachings of the present disclosure.

Referring to FIGS. 1 and 2, an electrical assembly 20 includes a cooling member 30, a bus bar assembly 32, and one or more electrical components 34. The one or more electrical components 34 are electrically connected to the bus bar assembly 32. Electrical current in the bus bar assembly 32 and/or the electrical component(s) 34 may generate heat and the cooling member 30 dissipates at least some of the heat.

A cooling member 30 includes a tubular member 40 and a cover 42 that covers and/or encloses at least some portions of the tubular member 40. The tubular member 40 is in fluid communication with a cooling fluid source 50 (e.g., a pump, a fan, others) that provides cooling fluid 52 to the tubular member 40. The cooling fluid 52 may, for example and without limitation, include coolant, glycol, water, and/or air, among others. The cooling fluid source 50 provides relatively cool cooling fluid 52 to the tubular member 40. As the cooling fluid 52 flows through the tubular member 40, the cooling fluid 52 absorbs heat generated by the bus bar assembly 32 and/or the electrical component(s) 34, such as via thermal conduction and/or convection. The heated cooling fluid 52 then flows out of the tubular member 40, such as back to the cooling fluid source 50, cooling/dissipating heat from the bus bar assembly 32 and/or the electrical component(s) 34.

With embodiments, a tubular member 40 may include one or more of a variety of configurations, such as generally shown in FIGS. 3 and 4. Referring to FIG. 3, a tubular member 40 having a U-shaped configuration is shown. The tubular member include an inlet 60 and an outlet 62 that are disposed proximate each other at the same end of the tubular member 40 with a intermediate section 64 that is U-shaped and connects the inlet 60 and outlet 62. Referring to FIG. 4, a tubular member 40 having a serpentine configuration is shown. The tubular member 40 includes an inlet 60 and an outlet that are disposed at opposite ends of the tubular member 40, and the intermediate section 64 includes a serpentine or wavy configuration and connects the inlet 60 and the outlet 62. The tubular member 40 includes a thermally conductive material that may also be electrically conductive, such as copper and/or aluminum, among others.

Referring to FIGS. 3-6, embodiments of tubular members 40 are shown with one or more sections (e.g., intermediate section 64) having non-circular cross-sections. For example, an intermediate section 64 of a tubular member 40 may include planar top and bottom surfaces 70, 72 and curved or rounded sides 74, 76, which may provide the intermediate portion 64 with a flat or "flattened" cross-section. However, the intermediate section 64 is not necessarily formed via flattening a circular tube and may be provided with a flat cross-section via other methods, such as via being formed (e.g., extruded, additive manufactured, others) initially with planar surfaces and/or being formed with rectangular cross-section. A flat/flattened configuration may increase cooling efficiency compared circular cross-sections as more cooling fluid 52 may be closer to the elements being cooled (e.g., the bus bar assembly 32, the electrical components 34). The sections having non-circular cross-sections may be enclosed by the cover 42. The cover 42 may include electrically insulating and/or thermally conductive material.

Figure 5:
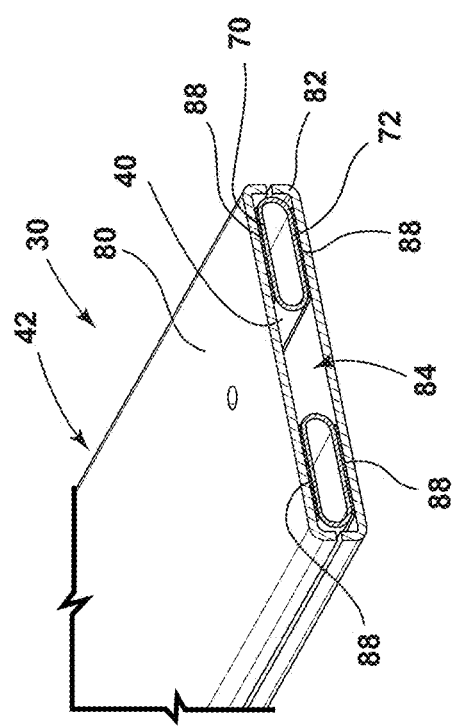
FIG. 5 is a partial cross-sectional view generally illustrating an embodiment of a cooling member of an electrical assembly according to teachings of the present disclosure.
Figure 6:
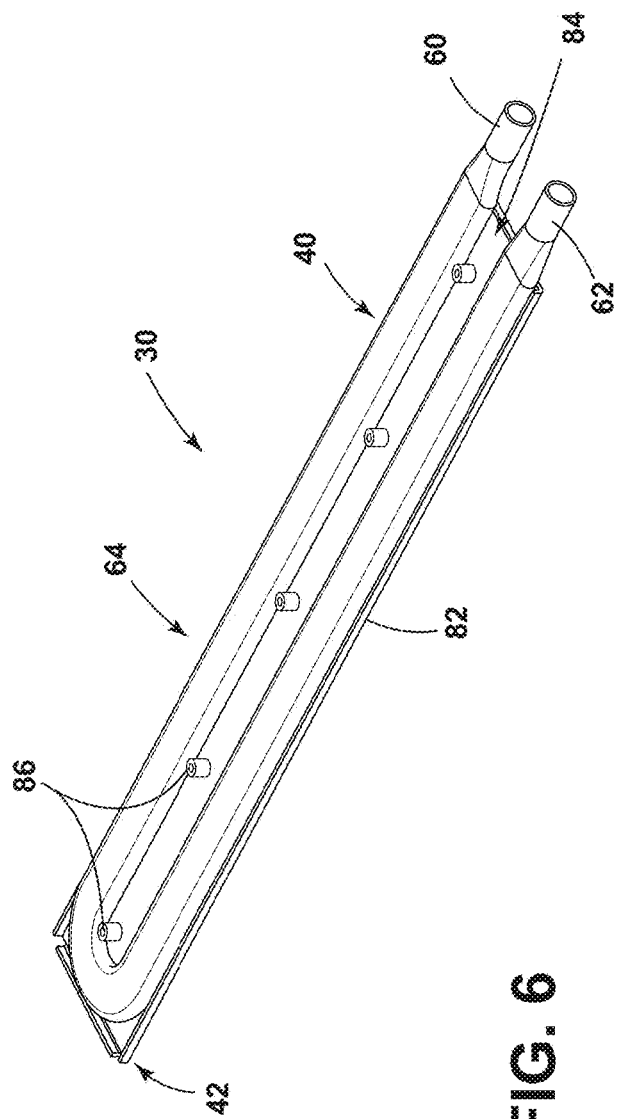
FIG. 6 is a perspective view generally illustrating portions of an embodiment of a cooling member of an electrical assembly according to teachings of the present disclosure.

Referring to FIG. 5, a cover 42 is shown having a first plate 80 and a second plate 82. The first plate 80 and the second plate 82 are connected together to at least partially enclose the tubular member 40. For example, the plates 80, 82 form a cavity 84 in which sections of the tubular member 40 are disposed. In some configurations, most or all of the intermediate section 64 is disposed in the cavity 84 and most or all of the inlet 60 and/or outlet 62 are disposed outside the cavity 84. The plates 80, 82 may be connected together via fasteners/bosses/spacers 86 (see, e.g., FIG. 6) and/or welding (e.g., vibration welding).

The cover 42 may be closely connected to the tubular member 40, such as via a tight thermal coupling. For example and without limitation, in configurations of the cover 42 with plates 80, 82, the plates 80, 82 may be connected to the tubular member 40 via one or more layers of thermal paste 88. A first layer of thermal paste 88 may be disposed between and in contact with the top surface 70 of the intermediate section 64. A second layer of thermal paste 88 between and in contact with the bottom surface 72 of the intermediate section 64. The layers of thermal paste 88 may be relative thin. For example and without limitation, a thickness of the layers of thermal paste 88 may be about 0.1 mm or less, such as 0.04 to 0.06 mm. These thin layers of thermal paste 88 may be significantly thinner than layers of potting material used with other designs, which may be 2.0-2.5 mm. Embodiments of a cooling member 30 may not include potting material. For example, potting material may not be disposed in the cavity 84 or in contact with the tubular member 40. Additional/secondary electrically insulating material may also be omitted from the cooling member 30 as the cover 42 may completely enclose the intermediate section 64.

Figure 7:
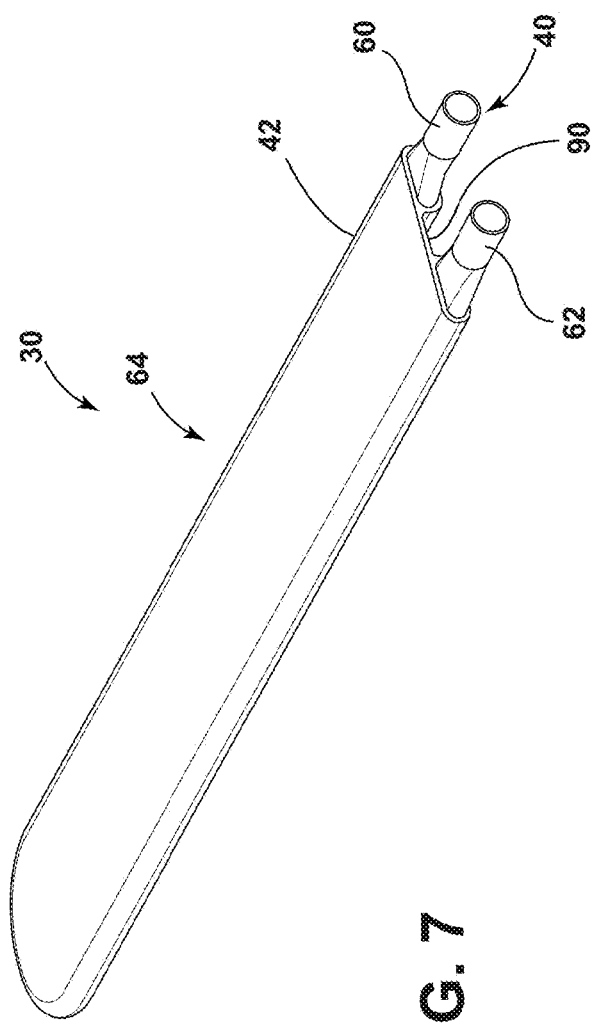
FIG. 7 is a perspective view generally illustrating an embodiment of a cooling member of an electrical assembly according to teachings of the present disclosure.
Figure 8:
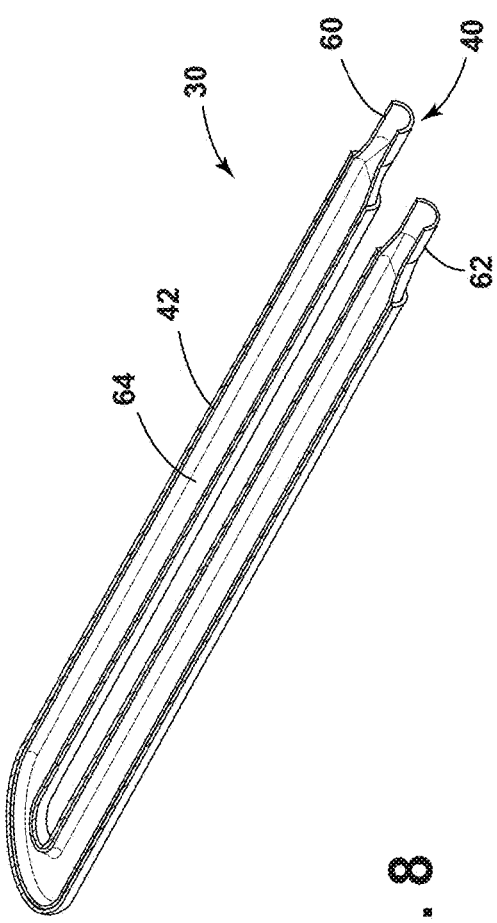
FIG. 8 is a cross-sectional perspective view generally illustrating an embodiment of a cooling member of an electrical assembly according to teachings of the present disclosure.

Referring to FIGS. 7-13, a cover 42 is formed onto a tubular member 40. For example, the cover 42 may be overmolded on, around, and directly in contact with some, most, or all of the intermediate section 64 such that some, most, or all of the intermediate section 64 is enclosed by the cover 42, which may electrically insulate the intermediate section 64. As shown in FIGS. 7 and 8, with a U-shaped intermediate section 64, a connecting portion 90 may be formed and connect between the legs of the U-shape. The connecting portion 90 may resemble a bridge. As shown in FIGS. 9 and 10, with a serpentine intermediate section 64, the cover 42 may be formed as a block around the outer dimensions of the intermediate section 64 and voids 92 may be provided/formed at the corners and between adjacent turns/bends to reduce the amount of material used while still enclosing some, most, or all of the intermediate section 64. With at least some overmolded embodiments, neither of thermal paste or potting material is present in the cooling member 30, and the cover 42 may be direct contact with some, most, or all of the intermediate section 64. To facilitate improved bonding between the tubular member 40 and the overmolded cover 42, a coating (e.g., a zinc coating) may be applied to the tubular member 40. The coating may be applied after the tubular member 40 is formed (e.g., post-extrusion) and may include an electrochemical process. In other configurations, the coating may be integrated with an extrusion process, such as by adding a thermal coating process.

Figure 11:
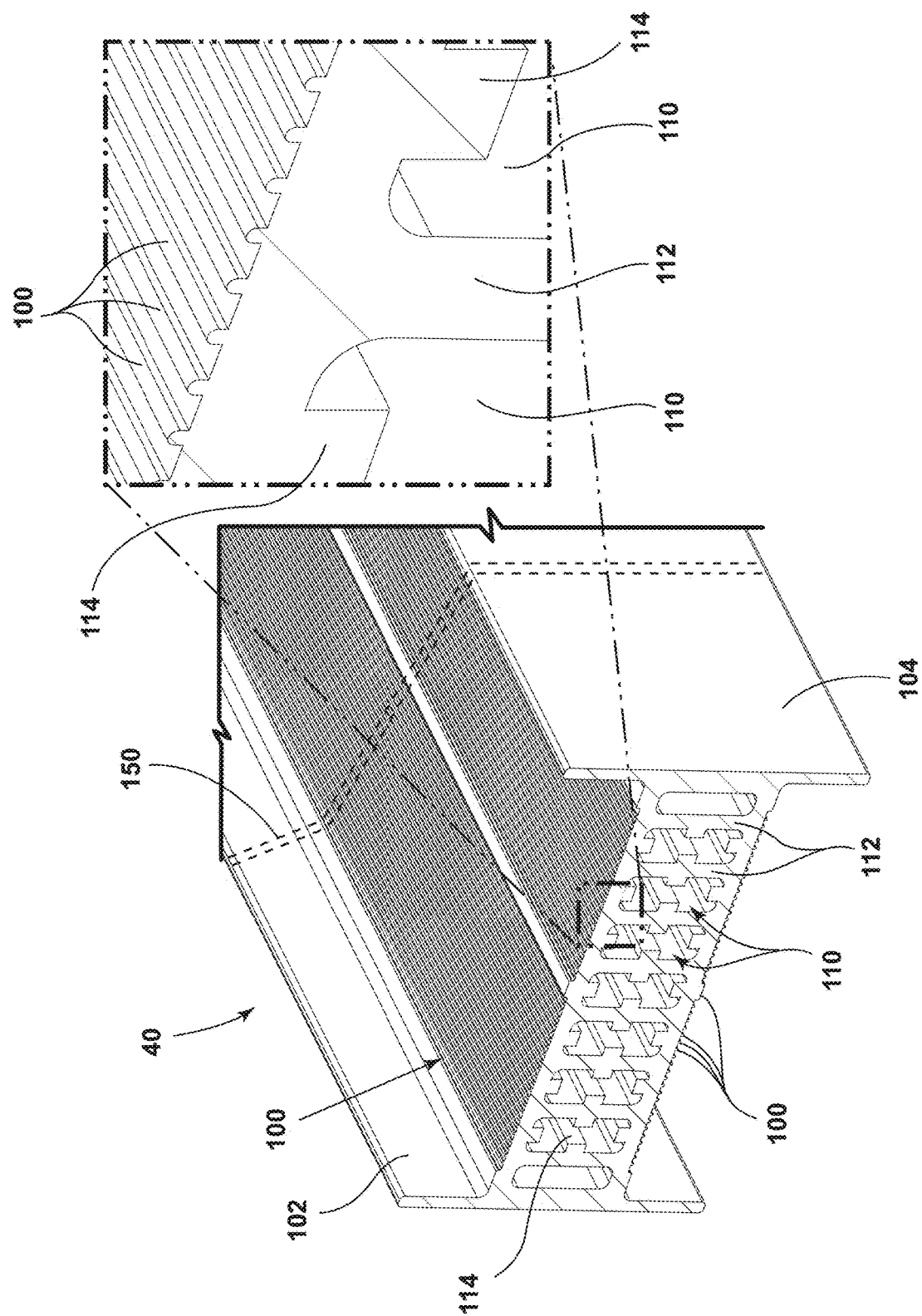
FIG. 11 is a partial cross-sectional perspective view, including an enlarged portion, generally illustrating a tubular member of an embodiment of an electrical assembly according to teachings of the present disclosure.
Figure 12:
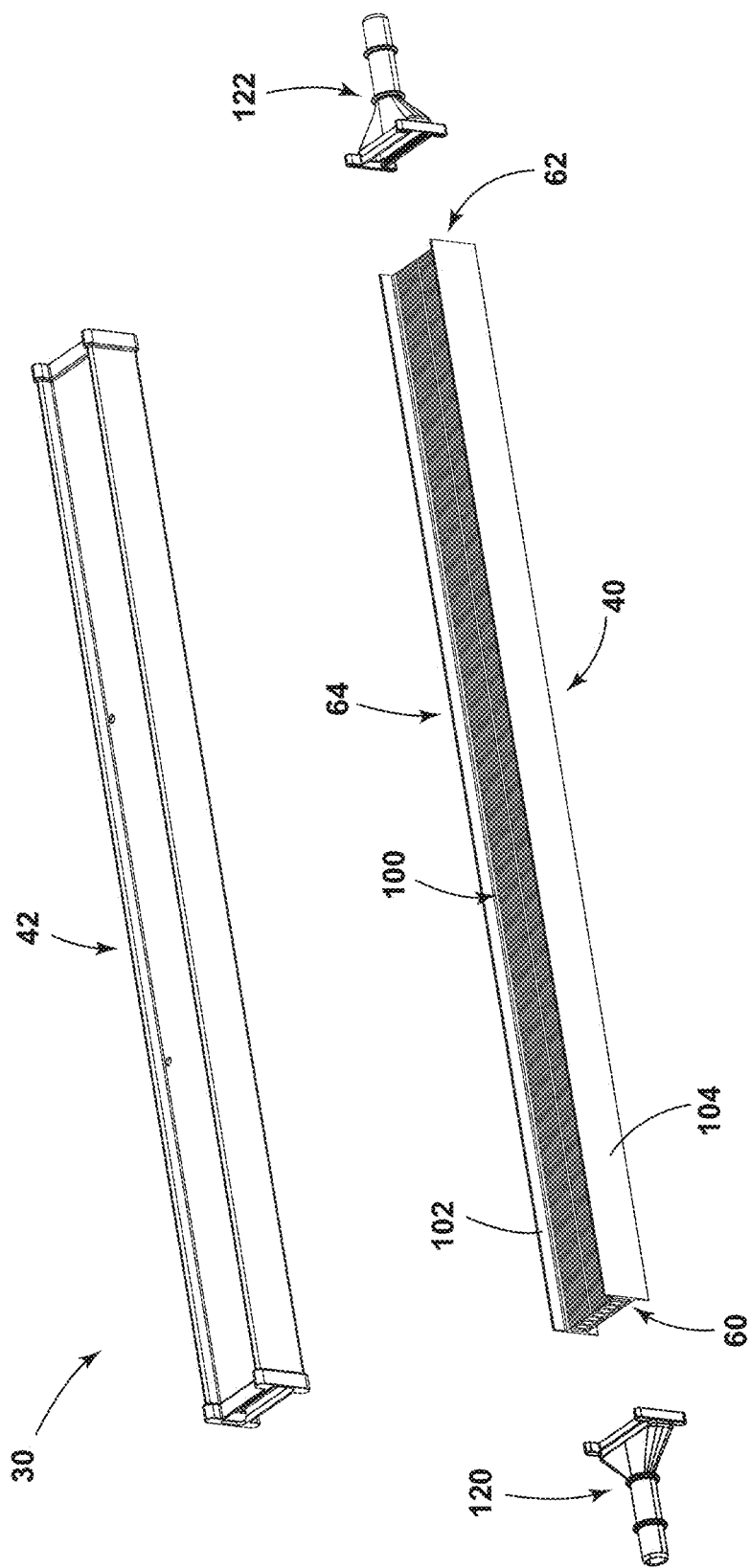
FIG. 12 is an exploded perspective view generally illustrating an embodiment of a cooling member of an electrical assembly according to teachings of the present disclosure.
Figure 13:
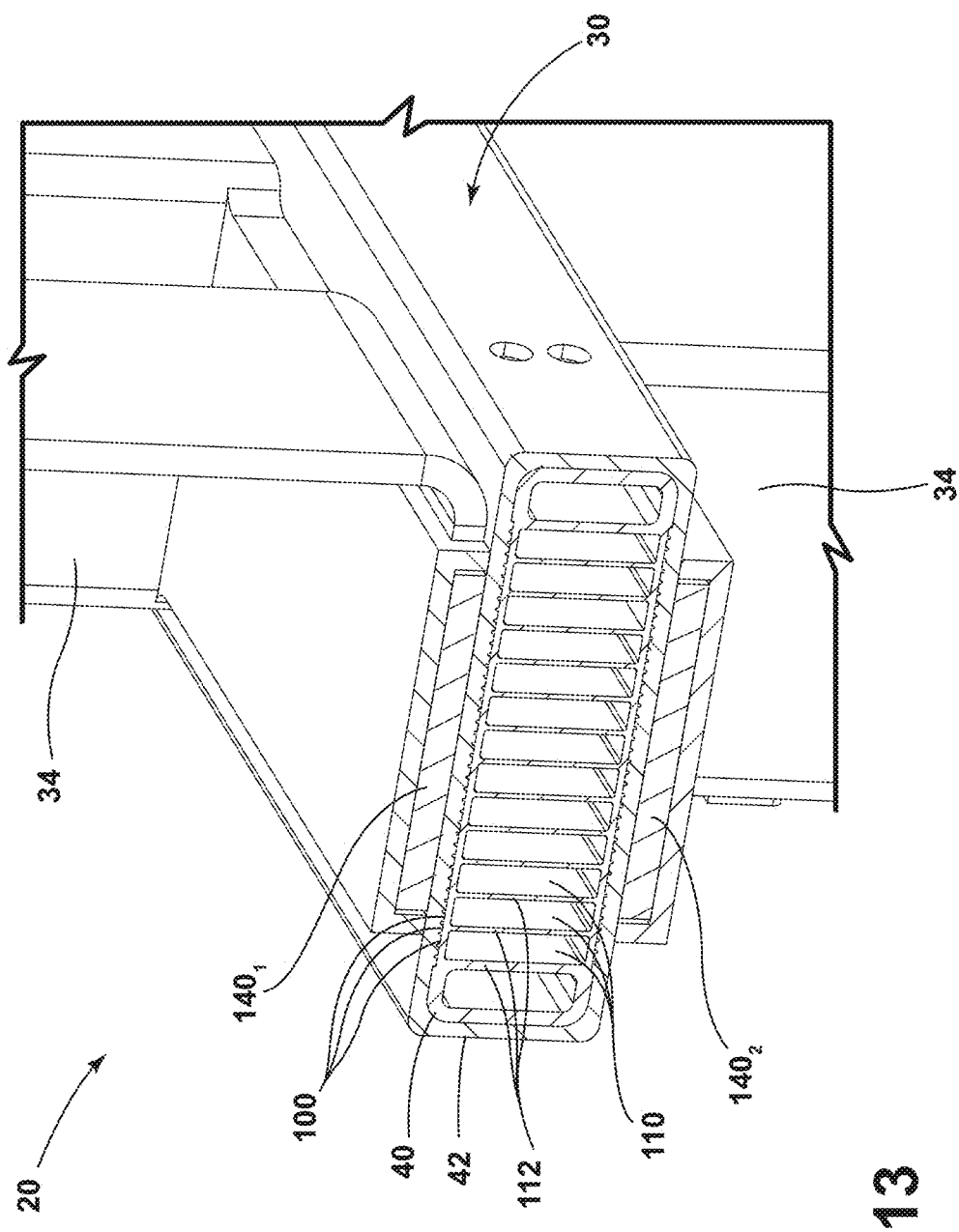
FIG. 13 is a partial cross-sectional perspective view generally illustrating an embodiment of an electrical assembly according to teachings of the present disclosure.

Referring to FIGS. 11-13, tubular members 40 are shown having one or more external ribs 100 on a top surface 70 and a bottom surface 72. The ribs 100 increase the surface area of the tubular member 40, which increase the bonding area between the tubular member 40 and the cover 42, which may facilitate overmolding of the cover 42 on the tubular member 40 and improved heat transfer and/or mechanical strength of the bond due to additional surface area between the cover 42 and the tubular member 40. For example and without limitation, the cover 42 may be overmolded on the tubular member 40 such that portions of the cover 42 are disposed between ribs 100. The ribs 100 may be relatively short. For example and without limitation, the height of the ribs 100 may be less than 10% and/or less than 5% of a height of the tubular member 40.

As generally illustrated in FIGS. 11 and 12, a tubular member 40 may include one or more flanges, such as flanges 102, 104, that may increase the stiffness of the tubular member 40. The flanges 102, 104 may, additionally or alternatively, providing mounting locations (e.g., apertures) for support the assembly 20 without sacrificing the cooling fluid flow area or creating a cooling fluid leakage path. The flanges 102, 104 may extend upward and downward from opposite sides of the tubular member 40, which may provide the tubular member 40 with a generally H-shaped cross-section.

Referring again to FIGS. 11 and 13, a tubular member 40 optionally includes one or more internal channels 110 that may be separate by internal walls 112. The internal walls 112 may increase the strength of the tubular member 40 and/or may increase the surface area of the tubular member 40 in contact with the cooling fluid 52, which may provide more efficient cooling. The internal walls 112 may be parallel to each other and may extend along some, most, or all of the length of the tubular member 40. In some examples, one or more protrusions 114 may extend from the internal walls 112 into the channels 110, which may further increase surface area and further increase cooling efficiency (see, e.g., FIG. 11). The cover 42 may include one or more locating or isolating features that may be formed during formation of the cover 42. A difference in thermal expansion between the tubular member 40 and the cover 42 may be compensated via one or more expansion joints 150 of the cover 42, that may be formed during formation of the cover 42 (see, e.g., FIGS. 9-11).

Figure 14:
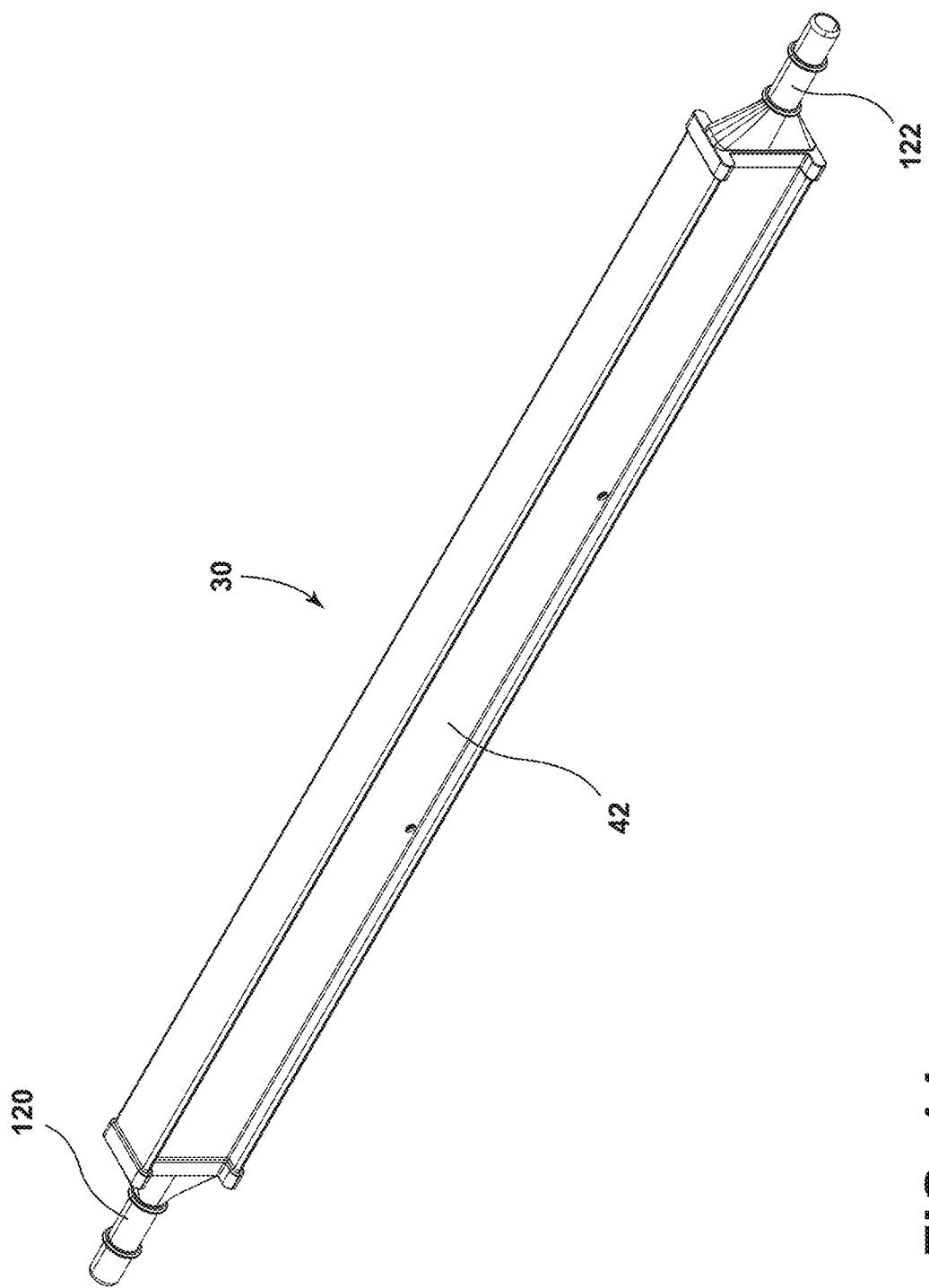
FIG. 14 is a perspective view generally illustrating an embodiment of a cooling member of an electrical assembly according to teachings of the present disclosure.
Figure 15:
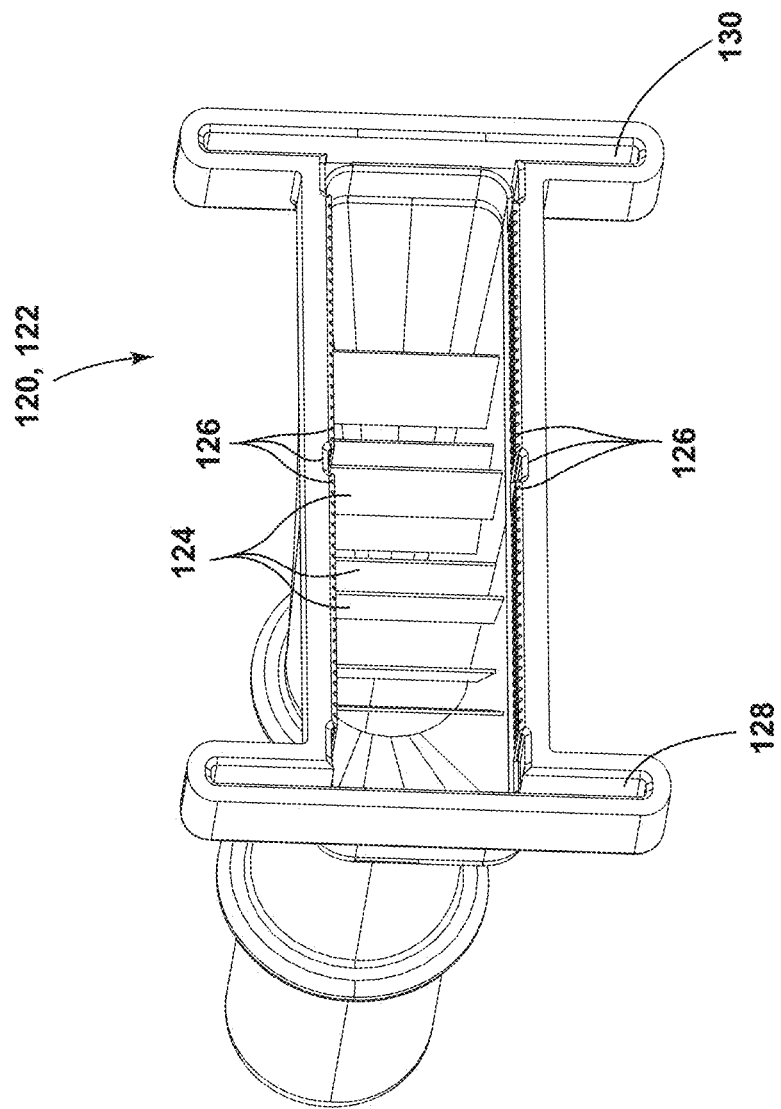
FIG. 15 is a perspective view generally illustrating an embodiment of an electrical assembly according to teachings of the present disclosure.

Referring to FIGS. 12 and 14, a cooling member 30 is shown having a first adapter 120 and a second adapter 122. The first adapter 120 connects to or functions as an inlet 60 of the tubular member 40 and the second adapter 122 connects to or functions as an outlet 62 of the tubular member 40 to convert the shape of the tubular member to a different shape. For example, the adapters 120, 122 may convert a non-circular cross-section (e.g., a generally rectangular cross-section) of the tubular member 40 to a circular cross-section, such as to mate with a circular/cylindrical fluid conduit. As shown in FIG. 15, the adapters 120, 122 may include one or more internal fins 124 to direct the flow of cooling fluid 52, such as to evenly or more evenly distribute cooling fluid 52 in the internal channels 110. If the tubular member 40 includes ribs 100, the adapters 120, 122 may include correspond recesses 126 that engage/receive the ribs 100. If the tubular member 40 includes flanges 102, 104, the adapters 120, 122 may include flange cavities 128, 130 that receive portions of the flanges 102, 104. The flange cavities 128, 130 may provide a first end of the adapters 120, 122 with a generally H-shaped cross-section.

Referring again to FIG. 1, a bus bar assembly 32 may include a plurality of pairs of bus bars 140 and a plurality of electrical components 34. Some or all of the electrical components 34 may be connected to a respective pair of bus bars 140. For example and without limitation, a first electrical component 34 may be connected to a first pair of bus bars 140 and a second electrical component 34 may be connected to a second pair of bus bars 140. The pairs of bus bars 140 may be disposed end-to-end (e.g., without contacting each other) such that centers of the pairs of bus bars 140 are aligned with each other.

Referring again to FIGS. 2 and 13, a bus bar assembly 32 and/or at least one electrical component 34 may be connected to two sides (e.g., top and bottom) of a cooling member 30. For example and without limitation, a first bus bar 140₁ may be disposed directly on a top side of the cover 42 of the cooling member 30 and a second bus bar 140₂ may be disposed directly on a bottom side of the cover 42. The bus bars 140 may be separated (e.g., electrically insulated) from the tubular member 40 only by the cover 42.

With embodiments, a method of assembling an electrical assembly 20 may include forming a tubular member 40 and a cover 42 of a cooling member 30, which may include forming the cover 42 separately from the tubular member 40 or overmolding the cover 42 on the tubular member 40. A bus bar assembly 32 may be connected to one or more sides of the cooling member 30. One or more electrical components 34 may be connected to the bus bar assembly 32 at one or more sides of the cooling member 30. A fluid source 50 may be connected to the tubular member 40 to provide cooling fluid 52 to the tubular member 40 and dissipate heat from the bus bar assembly 32 and/or the electrical component(s) 34.

Referring again to FIG. 1, a vehicle 200 may include an electrical assembly 20. For example and without limitation, the bus bar assembly 32 and/or the one or more electrical components 34 may be connected to one or more vehicle systems (e.g., motors, chargers, converters, among others).

With some embodiments, the bus bar assembly 32 and/or one or more electrical components 34 may be configured for use with high currents, such as at least 100 Amps, at least 200 Amps, or at least 400 Amps, or higher.

1. An assembly, comprising: an electrical component; a bus bar assembly connected with the electrical component; and a cooling member connected with the bus bar assembly, the cooling member including: a tubular member; and a cover enclosing portions of the tubular member, the cover comprising thermally conductive and electrically insulating material.

2. The assembly according to embodiment 1, wherein the enclosed portions of the tubular member include a non-circular cross-section.

3. The assembly according to any preceding embodiment, wherein at least some of the enclosed portions include planar top and bottom surfaces and curved or rounded side surfaces.

4. The assembly according to any preceding embodiment, wherein the tubular member includes a plurality of inner channels and/or surface features that increase contact between coolant and the tubular member.

5. The assembly according to any preceding embodiment, wherein the tubular member includes a first adapter connected to a first end of the tubular member and a second adapter connected to a second end of the tubular member.

6. The assembly according to any preceding embodiment, wherein the tubular member includes a plurality of external ribs to facilitate connection with the cover.

7. The assembly of according to any preceding embodiment, wherein the tubular member includes one or more flanges.

8. The assembly according to any preceding embodiment, wherein the cover includes a first plate and a second plate.

9. The assembly according to any preceding embodiment wherein the second plate is connected with the first plate via one or more fasteners and/or welding.

10. The assembly according to any preceding embodiment, wherein the assembly includes a layer of thermal paste disposed between at least a portion of the tubular member and at least a portion of the cover.

11. The assembly according to any preceding embodiment, wherein a thickness of the layer of thermal paste is 0.1 mm or thinner.

12. The assembly according to any preceding embodiment, wherein potting material is not disposed between the tubular member and the cover.

13. The assembly according to any preceding embodiment, wherein the cover is overmolded on the tubular member.

14. The assembly according to any preceding embodiment, wherein the cover is overmolded on the tubular member such that portions of the cover are disposed between external ribs of the tubular member.

15. The assembly according to any preceding embodiment, wherein the cover is in direct contact with the bus bar assembly and the cooling member.

16. The assembly according to any preceding embodiment, wherein the bus bar assembly is configured for use with electrical currents of at least 200 Amps.

17. The assembly according to any preceding embodiment, wherein the bus bar assembly includes a plurality of pairs of bus bars disposed directly on the cover in an end-to-end configuration.
18. The assembly according to any preceding embodiment, wherein the electrical component includes a first contactor that is electrically connected to a first pair of bus bars of the plurality of pairs of bus bars; and the assembly includes a second contactor that is electrically connected to a second pair of bus bars of the plurality of pairs of bus bars.
19. The assembly according to any preceding embodiment, wherein the bus bar assembly includes a first bus bar disposed on a top surface of the cover and a second bus bar disposed on a bottom surface of the cover.
20. A vehicle including the assembly according to any preceding embodiment.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

"One or more" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first element could be termed a second element, and, similarly, a second element could be termed a first element, without departing from the scope of the various described embodiments. The first element and the second element are both element, but they are not the same element.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

All matter contained in the above description or shown in the accompanying drawings shall be interpreted as illustrative only and not limiting. Changes in detail or structure may be made without departing from the present disclosure.

What is claimed is:

1. An assembly, comprising:
   an electrical component;
   a bus bar assembly connected with the electrical component; and
   a cooling member connected with the bus bar assembly, the cooling member comprising:
   a tubular member; and
   a cover configured to enclose a portion of the tubular member, wherein the cover is overmolded on the tubular member, such that at least a portion of the overmolded cover is disposed between external ribs of the tubular member, and wherein the cover comprising thermally conductive and electrically insulating material.

2. The assembly of claim 1, wherein the portion of the tubular member enclosed by the cover include a non-circular cross-section.

3. The assembly of claim 2, wherein the portion of the tubular member that is enclosed by the cover include planar top and bottom surfaces and curved or rounded side surfaces.

4. The assembly of claim 1, wherein the tubular member includes at least one of a plurality of inner channels and surface features that increase contact between a coolant and the tubular member.

5. The assembly of claim 1, wherein the tubular member includes a first adapter connected to a first end of the tubular member and a second adapter connected to a second end of the tubular member.

6. The assembly of claim 1, wherein the tubular member includes a plurality of external ribs to facilitate connection with the cover.

7. The assembly of claim 1, wherein the tubular member includes one or more flanges.

8. The assembly of claim 1, wherein the cover is in direct contact with the bus bar assembly and the cooling member.

9. The assembly of claim 1, wherein the bus bar assembly is configured for use with electrical currents of at least 200 Amps.

10. The assembly of claim 1, wherein the bus bar assembly includes a plurality of pairs of bus bars disposed directly on the cover in an end-to-end configuration.

11. The assembly of claim 10, wherein the electrical component includes: a first contactor that is electrically connected to a first pair of bus bars of the plurality of pairs of bus bars; and a second contactor that is electrically connected to a second pair of bus bars of the plurality of pairs of bus bars.

12. The assembly of claim 1, wherein the bus bar assembly includes a first bus bar disposed on a top surface of the cover and a second bus bar disposed on a bottom surface of the cover.

13. A vehicle including the assembly of claim 1.

14. The assembly of claim 1, wherein the portion of the tubular member enclosed by the cover is U-shaped.

15. The assembly of claim 1, wherein the portion of the tubular member enclosed by the cover is serpentine shaped.

16. The assembly of claim 1, wherein the cover comprises one or more expansion joints, the joints compensating for a difference in thermal expansion between the tubular member and the cover.

17. The assembly of claim 5, wherein each of the first adaptor and the second adaptor comprises one or more internal fins, the fins directing a flow of a coolant through the tubular member.

18. The assembly of claim 1, wherein the assembly further comprises a zinc coating disposed over the tubular member forming a bond between the tubular member and the cover.

19. The assembly of claim 1, wherein a height of the external ribs is less than 10% of a height of the tubular member.

* * * * *